United States Patent [19]

Derryberry et al.

[11] Patent Number: 4,862,247
[45] Date of Patent: Aug. 29, 1989

[54] CONTACT JOINT FOR SEMICONDUCTOR CHIP CARRIERS

[75] Inventors: Lesli Derryberry, Dallas; Tom Petrovich, Richardson, both of Tex.

[73] Assignee: Texas Instruments Incorporated, Dallas, Tex.

[21] Appl. No.: 302,997

[22] Filed: Jan. 26, 1989

Related U.S. Application Data

[63] Continuation of Ser. No. 124,803, Nov. 24, 1987, abandoned.

[51] Int. Cl.$^4$ ............... H01L 23/30; H01L 23/04; H01L 23/14
[52] U.S. Cl. .................................... 357/74; 357/80; 357/68
[58] Field of Search ............... 357/80, 74, 68, 70; 361/405; 174/52.4, 52.2

[56] References Cited

U.S. PATENT DOCUMENTS 4,463,217  7/1984  Orcutt ..................... 174/52 FD
4,510,519  4/1985  Dubois et al. ............ 357/80
4,703,393  10/1987 Yamamoto et al. ....... 174/52 FD
4,706,105  1/1987  Masuda et al. ........... 357/74

FOREIGN PATENT DOCUMENTS 55-966658  7/1980  Japan ..................... 357/74

Primary Examiner—Rolf Hille
Assistant Examiner—S. V. Clark
Attorney, Agent, or Firm—Stanton Braden; Rodney M. Anderson; Melvin Sharp

[57] ABSTRACT

A chip carrier (34) having a peripheral edge (40), a bottom surface (42) and an inwardly directed arcuate connecting surface (44) is provided. The chip carrier (34) is connected to a printed wiring board (36) by solder (38). The solder (38) adheres to the metallized portion (46) on the chip carrier (34) and the metallized portion (48) on the printed wiring board (36). The connecting surface (44) allows stress to be more evenly distributed to reduce the occurrence of the cracks in the solder (38) which cause failure of the circuit.

4 Claims, 1 Drawing Sheet

CONTACT JOINT FOR SEMICONDUCTOR CHIP CARRIERS

This application is a continuation of application Ser. No. 124,803, filed Nov. 24, 1987, now abandoned.

TECHNICAL FIELD OF THE INVENTION

This invention relates in general to semiconductor devices, and in particular to an improved contact joint for semiconductor chip carriers.

BACKGROUND OF THE INVENTION

Semiconductor chips are conventionally placed onto chip carriers which are affixed to a printed wiring board for insertion into an electronic device. Design specifications require that the chip carriers be able to resist a series of temperature increases and decreases without failing. Temperature variations tend to cause failure in the solder joints where the chip carriers are connected to the printed wiring boards. A typical failure is a crack in the solder joint at the corners of the chip carrier, which cause a loss of electrical continuity. The cracks occur due to the different thermal expansion rates of the ceramic material from which the chip carrier is made and the material from which the wiring board is made, which may comprise for example, an epoxy/glass laminate. A typical ceramic chip carrier has an expansion rate in the range of 7 parts per million per degree Centigrade (ppm/° C.) versus 15 ppm/° C. of an epoxy/glass laminate printed wiring board.

One attempt to prevent failures in the solder joints has been to provide a better match between the temperature expansion rates of the chip carrier material and the printed wiring board material. Different kinds of chip carriers may be utilized in an attempt to better match the expansion rates; however, the printed wiring board material typically is not a viable option, especially when dealing with rigid military specifications. It has thus not been heretofore possible to find useable materials having thermal expansion rates that match closely enough to eliminate cracks in the solder joints.

Another attempted solution has been to apply more solder to the joint. This method overfills the joint with solder to form a convex surface. By adding more solder, a crack must travel further before total failure occurs. This method is merely a stopgap and is not a solution, as more solder has produced only limited success while adding cost and taking up valuable space.

Another attempt to resolve the problem has been to use a wire lead that can be soldered to the wiring board and brazed to the chip carrier. This method is expensive, takes up valuable space and still runs a high risk of failure. Thus, a need exists for an improved contact joint between a chip carrier and a printed wiring board that will reduce the occurrences of cracks in the solder due to temperature variations.

SUMMARY OF THE INVENTION

The present invention disclosed and claimed herein describes an improved contact joint for semiconductor chip carriers and method which substantially eliminates problems associated with prior contact joints between chip carriers and printed wiring boards. The present invention provides a greater surface area on the chip carrier for contact with the solder joint between the chip carrier and the printed wiring board, thereby reducing the likelihood of a solder crack causing failure of the device.

In accordance with one aspect of the present invention, an improved contact joint between the metallized portions of a chip carrier and the pads on a printed wiring board is provided. The chip carrier has a peripheral edge and a bottom surface. A connecting surface is directed inwardly from the peripheral edge toward the bottom surface to provide connection therebetween. The connecting surface provides a greater area of contact with the solder between the chip carrier and the printed wiring board and reduces the likelihood of stress being concentrated at a single point.

In another aspect of the present invention, the connecting surface is an arcuate surface. The chip carrier is formed in a mold having a connecting surface already designed into it. Alternatively, the chip carrier is molded and the connecting surface is then formed by a grinding device.

It is a technical advantage of the present invention that the number of failures in the solder connection between a chip carrier and a printed wiring board is substantially reduced. This technical advantage is achieved by providing a greater surface area for contact with the solder to reduce the likelihood of stress concentrating at a single point between the chip carrier and the solder.

BRIEF DESCRIPTION OF THE DRAWINGS

For a more complete understanding of the present invention and for further advantages thereof, reference is now made to the following Detailed Description taken in conjunction with the accompanying Drawings in which.

DETAILED DESCRIPTION OF THE INVENTION

Figure 1:
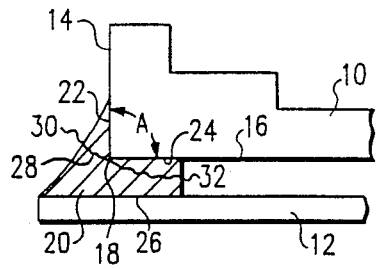
FIG. 1 is a cross-sectional view of the prior art.

Referring to FIG. 1, a chip carrier 10 and a printed wiring board 12, as are well known in the art, are shown assembled together. The chip carrier 10 has a vertical peripheral edge 14 and a flat bottom surface 16. The peripheral edge 14 and the bottom surface 16 meet at a point 18 to form a right angle A. Solder 20 is applied to metallized portions 22 on the peripheral edge 14, metallized portions 24 on the bottom surface 16 and to metallized portion 26 on the printed wiring board 12. Any stress that is applied to the chip carrier 10 and to the printed wiring board 12 is concentrated at the point 18. Thus, stress will initiate a crack, such as indicated by line 28, at the point 18. The crackline 28 will propagate outward and will eventually reach the limits of the solder 20 such as at points 30 and 32. The crack 28 may induce a failure by electrically isolating the metallized portions 22 and 24 on the chip carrier 10 from the metallized portion 26 of the printed wiring board 12.

Figure 2:
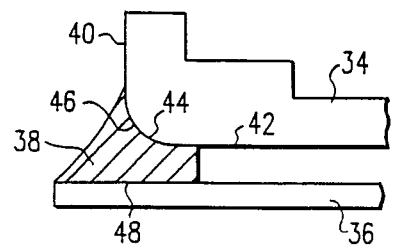
FIG. 2 is a cross-sectional view of the preferred embodiment of the present invention.

Referring to FIG. 2, the preferred embodiment of the present invention is shown as chip carrier 34. The chip carrier 34 is soldered to the printed wiring board 36 by solder 38. The chip carrier 34 has a peripheral edge 40, a bottom surface 42 and an arcuate connecting surface 44. The arcuate connecting surface 44 is inwardly directed from the peripheral edge 40 toward the bottom surface 42. The solder 38 adheres to a metallized portion 46 which is on the peripheral edge 40, the bottom surface 42 and the arcuate connecting surface 44. The metallized portion 46 is connected by solder 38 to the metallized portion 48 on the printed wiring board 36. The metallized portion 46 is formed by any appropriate manner, such as, for example, by firing on a first layer of tungsten, plating on a second layer of nickel and plating on a third layer of gold, as is well known in the art. The chip carrier 34 may be any appropriate material, such as ceramic. The printed wiring board 36 may be, for example, a glass/epoxy laminate.

Figure 3:
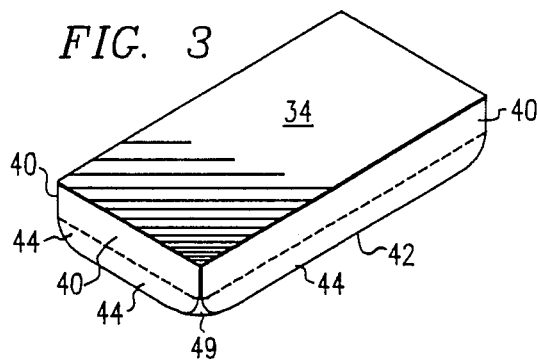
FIG. 3 is a perspective view of the chip carrier of FIG. 2.

Referring to FIG. 3, a view of the chip carrier 34 of FIG. 2 is shown in perspective. In perspective, the arcuate connecting surface 44 can be seen to curve inwardly from the peripheral edge 40 to the bottom surface 42 all along the perimeter of the chip carrier 34. The four corners of the chip carrier 34, for example, corner 49, are formed, if desired, so that the arcuate connecting surface 44 has no sharp corners or points.

The shape of the arcuate connecting surface 44 replaces the sharp edges of the previously known chip carriers. Due to the arcuate shape, there are no longer any obvious stress concentration points to initiate a crack in the solder, as with the previously known chip carriers. Thus, the stress caused by thermal expansion will be evenly spread over the arcuate connecting surface 44, lessening the likelihood of a crack.

The arcuate connecting surface 44 may be formed by any appropriate method, including molding or grinding. The molding method requires that the mold in which the chip carrier is formed have a connecting surface designed into it. Thus, when the chip carrier is removed from the mold and fired (to harden the ceramic material), the chip carrier will already have the connecting surface which may then be metallized.

The grinding method requires the chip carrier be mechanically ground to form the connecting surface after the chip carrier has been molded and fired. The metalization may be applied before or after the grinding step, but if done before grinding, may require additional metallization as the grinding may remove some of the metal. Other techniques of forming the arcuate connecting surface 44 will suggest themselves to one skilled in the art.

Figure 4:
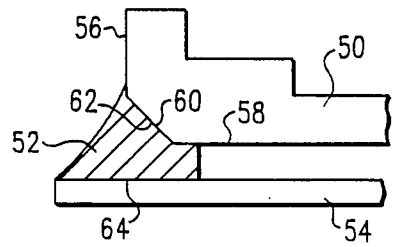
FIG. 4 is a cross-sectional view of an alternate embodiment of the present invention.

Referring to FIG. 4, an alternative embodiment of the present invention is shown. A chip carrier 50 is attached by solder 52 to a printed wiring board 54. The chip carrier 50 has a peripheral edge 56, a bottom surface 58 and a beveled connecting surface 60. The beveled connecting surface 60 is angled inwardly from peripheral edge 56 to the bottom surface 58. The metallized portion 62 on the chip carrier 50 is connected to the metallized portion 64 on the printed wiring board 54 by the solder 52.

Figure 5:
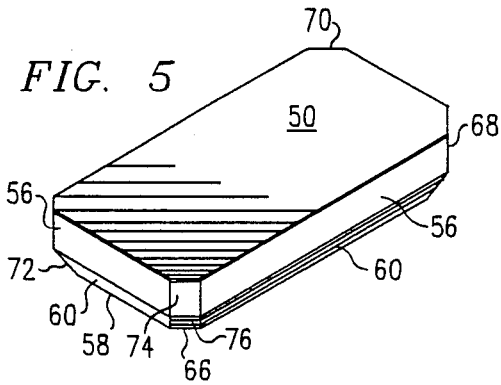
FIG. 5 is a perspective view of the chip carrier of FIG. 4.

Referring to FIG. 5, a view of the chip carrier 50 of FIG. 4 is shown in perspective. In perspective, the beveled connecting surface 60 can be seen to slope inwardly from the peripheral edge 56 to the bottom surface 58 all along the perimeter of the chip carrier 50. The corners 66, 68, 70 and 72 of the chip carrier can be formed, as required, depending upon whether metallization is to be applied. If a corner is to be metallized, such as, for example, corner 66, the entire corner may be provided with an angled peripheral edge 74 as well as a beveled connecting surface 76. If the corner is not to be metallized, such as, for example, corner 72, the beveled connecting surface 60 will not require special edges, such as with corner 66.

The shape of the beveled connecting surface 60, replaces the sharp edges of the previously known chip carriers. Due to the beveled shape, there are no longer obvious stress concentration points to initiate a crack in the solder, as with the previously known chip carriers. Thus, the stress caused by thermal expansion will be more evenly spread over the beveled connecting surface 60, lessening the likelihood of a crack.

The beveled connecting surface 60 is formed by any appropriate means, such as, for example, mechanical punching, laser punching, molding or grinding. Mechanical punching and laser punching methods require a variation to the current castellation method. In the current castellation method, holes with vertical sidewalls are punched through a chip carrier and the holes are metallized. A light cut or dent is made along a line connecting the centers of the holes, and the chip carrier is broken along the dent to expose the metallization which provides leads for the chip carrier. The present invention requires the holes be formed with a connecting surface and, therefore, a subsequent punching step is necessary to form the beveled edge.

Although not shown, it is to be understood that the connecting surfaces such as 44 in FIG. 2 and 60 in FIG. 3 can be other shapes, other than a right angle as per FIG. 1. The objective of the present invention is to provide a greater surface area for contact with the solder to eliminate the concentration of stress at a single point.

Although the present invention has been described with respect to its specific preferred embodiment thereof, various changes and modifications may be suggested to one skilled in the art and it is intended that the present invention encompass such changes and modifications as fall within the scope of the appended claims.

What is claimed is:

1. An improved leadless chip carrier including a contact area for joining the chip carrier to conductive pad on a printed wiring board, the leadless chip carrier further including:
   a peripheral edge;
   a bottom surface; and
   a connecting surface including a metallized solder adhering portion flush with the face of the connecting surface, the connecting surface being directed inwardly toward the bottom surface from the peripheral edge to the bottom surface, in order to provide a contact area which allows for an improved distribution of stress in a joint between the chip carrier and the wiring board.

2. The improved chip carrier of claim 1, wherein said connecting surface includes an arcuate surface.

3. The improved chip carrier of claim 1, wherein said connecting surface includes a beveled surface.

4. The improved chip carrier of claim 1, wherein said peripheral edge, said bottom surface and said connecting surface are metallized to match with the conductive pads on the printed wiring board.

* * * * *